United States Patent [19]
Takahashi et al.

[11] Patent Number: 5,950,086
[45] Date of Patent: Sep. 7, 1999

[54] METHOD OF FABRICATING AN EPROM TYPE DEVICE WITH REDUCED PROCESS RESIDUES

[75] Inventors: Satoshi Takahashi; Tatsuya Kajita; Hideo Kurihara; Hideki Komori; Masaaki Higashitani, all of Kawasaki, Japan

[73] Assignee: Fujitsu Limited, Kanagawa, Japan

[21] Appl. No.: 08/878,119

[22] Filed: Jun. 18, 1997

[30] Foreign Application Priority Data

Nov. 28, 1996 [JP] Japan ................................ 8-318130

[51] Int. Cl.⁶ .............................................. H01L 21/336
[52] U.S. Cl. ............................................. 438/258; 438/257
[58] Field of Search ................................. 438/258, 257; 364/490, 491

[56] References Cited

U.S. PATENT DOCUMENTS 5,304,503  4/1994  Yoon et al. ............................. 437/43
5,834,351  11/1998 Chang et al. ........................... 438/266

*Primary Examiner*—John F. Niebling
*Assistant Examiner*—Neal Berezny
*Attorney, Agent, or Firm*—Armstrong, Westerman, Hattori, McLeland & Naughton

[57] ABSTRACT

A semiconductor device is fabricated by the step of forming a first device isolation film in a peripheral circuit region by the use of a first pattern and a second device isolation film in a memory cell region by the use of a second pattern; forming a first conducting film processed by the use of a third pattern having a pattern-to-be-removed in a peripheral edge of the memory cell region; the step of forming an insulation film covering the memory cell region and processed by the use of a fourth pattern whose peripheral edge is positioned on the pattern-to-be-removed of the third pattern; and the step of forming a second conducting film processed by a fifth pattern.

12 Claims, 18 Drawing Sheets

METHOD OF FABRICATING AN EPROM
TYPE DEVICE WITH REDUCED PROCESS
RESIDUES

BACKGROUND OF THE INVENTION

The present invention relates to a method for fabricating a semiconductor device, more specifically to a method for fabricating a semiconductor device including a floating gate.

As larger scale, higher integration, and higher performance are recently required of LSIs, semiconductor devices themselves are further micronized. For higher integration of a semiconductor device, micronization of not only the semiconductor device itself, but also of a device isolation region defining a device region are important.

As the device isolation method, the so-called LOCOS (LOCal Oxidation of Silicon) method which thermally oxidizes a silicon substrate with silicon nitride film as a mask to locally form oxide film has been conventionally used.

In LOCOS technique, however, oxygen is diffused also below the silicon nitride film from the edges of a pattern of the silicon nitride film to form the so-called a bird's beak. The device isolation film intrudes into the device region by a length of the bird's beak. The length of the bird's beak is longer as the device isolation film is thicker. For further micronization of a device, it is preferable to make the device isolation film as thin as possible.

On the other hand, a semiconductor device including a floating gate, such as a flash EEPROM, EPROM or others, requires high voltage for write/erase of a memory cell. However, it is difficult to reduce the voltage for the write-erase, which makes it difficult to make the device isolation film for a peripheral circuit region for increase to the high voltage.

To satisfy these contradictory ends, in a semiconductor device, such as a flash EEPROM, EPROM or others, it is common that a thin device isolation film is formed in a memory cell region especially requiring integration, and a thick device isolation film is formed in a peripheral circuit region requiring high voltage resistance.

An example that a method for fabricating a semiconductor device, in which device isolation films which are different in thickness from each other are formed by LOCOS technique is applied to a semiconductor device including a floating gate will be explained.

FIG. 16 shows one example of the mask layout on a peripheral edge of a memory cell including a floating gate. In FIG. 16, the upper left part of the SAE mask substantially corresponds to the memory cell region, and the lower right part of the SAE mask substantially corresponds to the peripheral circuit region.

First, a silicon nitride film is deposited on a silicon substrate through a pad oxide film.

Then, the silicon nitride film in the peripheral circuit region where the thick device isolation film is to be formed is selectively removed. Then, the silicon nitride film in the memory cell region where the thinner device isolation film is to be formed is not removed. The mask used in patterning the silicon nitride film will be hereinafter called "S/D (source/drain) mask".

Subsequently, with the silicon nitride film as a mask, the silicon substrate is thermally oxidized to form an oxide film of a required thickness in the peripheral circuit region.

Then, the silicon nitride film in the memory cell region is selectively removed. The silicon nitride film will remain only in a region which is to be the device region. The mask for patterning the silicon nitride film will be hereinafter called "Core S/D (core source/drain) mask".

Then, the silicon substrate is thermally oxidized with the silicon nitride film as a mask. In this oxidation, the device isolation film is formed by the two steps of oxidation in the peripheral circuit region where the oxide film of a required thickness has been formed. Thus, a thin device isolation film is formed in the memory cell region, and a thick device isolation film is formed in the peripheral circuit region.

Then, the silicon nitride film remaining in the device region is removed.

Next, a silicon oxide film which is to be a tunnel oxide film of a memory cell transistor is formed in the device region.

Then, a polycrystalline silicon film which is to be a floating gate is formed on the entire surface, and the polycrystalline silicon film in the memory cell region is processed in a prescribed pattern. At this time, the entire peripheral circuit region is covered with the polycrystalline silicon film. The mask for patterning the polycrystalline silicon film will be hereinafter called "Poly 1 mask".

Subsequently an ONO film (a laminated film of the silicon nitride film sandwiched by the silicon oxide film) which is an insulation film between the floating gate and a control gate is formed.

Then, the ONO film and the polycrystalline silicon film in the peripheral circuit region are removed. The mask for patterning the ONO film and the polycrystalline silicon film will be hereinafter called "ONO mask".

Next, a silicon oxide film which is to be a gate insulation film of a transistor for a peripheral circuit is formed.

Subsequently, a laminated film of a polycrystalline silicon film and a tungsten silicide film is deposited and patterned to form the control gate in the memory cell region and a gate electrode of the transistor for a peripheral circuit in the peripheral circuit region. The mask for patterning the control gate will be hereinafter called "Poly 2 mask".

Then, a photoresist covering the peripheral circuit region is formed, and the ONO film and the polycrystalline silicon film are patterned with the control gate as a mask. Thus, the floating gate which has been formed below the control gate through the insulation film is in alignment with the control gate. The mask for patterning the floating gate will be hereinafter called "SAE (Self Align Etch) mask".

The semiconductor device including the floating gate has been thus fabricated.

However, in the above-described conventional method for fabricating a semiconductor device, residue of the ONO film and the polycrystalline silicon film often is left on steps formed in the device isolation films, etc.

Causes for the residue will be explained.

FIG. 17 is sectional views of the semiconductor device in the steps of the method for fabricating the same, which explain disadvantages of the same.

In the layout shown in FIG. 16, the S/D mask for forming the thick device isolation film is formed inner of the memory cell than the Core S/D for patterning the thin device isolation film.

In this layout, because none of the silicon nitride film remains in the region (shaded) enclosed by the Core S/D mask and the S/D mask when the silicon nitride film is etched by using the Core S/D as the mask, the oxide film 20 which is to be the thick device isolation film 24 is etched at the same time of the etching of the silicon nitride film to form a step at their border (FIG. 17A to 17B).

Because of a step thus formed in the device isolation film 24, when the ONO film 32 and the polycrystalline silicon film 30 are removed by anisotropic etching using the ONO mask, often the ONO film 32 is not completely removed and remain on the step. With the ONO film 32 remaining on the step, the etching of the base polycrystalline silicon film 30 goes on with the ONO film 32 as the mask, and often residue of the polycrystalline silicon film 30 remains on the step (FIGS. 17C to 17D).

It is an idea to remove the residue by overetching, but it is difficult to remove the residue by overetching in a region having steps generated by various fabrication steps as shown in FIG. 16.

Also by removing the ONO film 32 by isotropic etching the residue can be decreased, but it is difficult to uniformly etch the ONO film 32, which is a layer of the films having etching characteristics different from each other.

The ONO film 32 is deposited also on the sidewall of the polycrystalline silicon film 30 etched, using the Poly 1 mask (FIG. 17D). Accordingly, the ONO film 32 remains in this region even after the ONO film 32 and the polycrystalline silicon film 30 are removed, using the ONO mask (FIG. 17E).

To remove the ONO film 32, it is necessary to overetch the ONO film 32 by a thickness of the polycrystalline silicon film 30. When the ONO film 32 remains as residue 50, there is a risk that the residue 50 may peel to be particles in the self-alignment etching step of patterning the floating gate (the step of etching using the SAE mask).

However, the overetching sufficient to remove the ONO film 32 remarkably etches even the device isolation film 32 exposed on the surface, which makes it difficult to maintain the device isolation film 24 sufficiently thick. Especially in a region 54 with the control gate extended in to which a high voltage is to be applied, it is not preferable that the device isolation film 24 is made thin.

By laying the S/D mask outside the Core S/D mask as shown in FIG. 18, the formation of a step in the device isolation film 24 can be prevented. However, an active region is formed in the region 56 in FIG. 18, but none of the polycrystalline silicon film 30 of the same layer as the floating gate is formed on the region, so that the silicon substrate is dug in the etching step using the ONO mask and the etching step using the SAE mask. Accordingly, unpreferably the fabricating of the semiconductor device by the use of the layout of FIG. 18 has a risk that the surface planarization may be deteriorated, and the junction leak current is large. In addition, it is difficult to remove residue of a conducting film to be the control gate from the step formed in the region 56.

SUMMARY OF THE INVENTION

An object of the present invention is to provide a method for fabricating a semiconductor device including a floating gate which can easily remove residue generating in a step.

The above-described object is achieved by a method for fabricating a semiconductor device comprising: a device isolation film forming step of oxidizing a semiconductor substrate with a mask film having a first pattern as a mask to form an oxide film in a device isolation region of a peripheral circuit region and oxidizing the semiconductor substrate with a mask film having a second pattern as a mask to form a first device isolation film which is formed by further oxidizing said oxide film, and a second device isolation film in a memory cell region; a first conducting film forming step of depositing a first conducting film to be a floating gate on the semiconductor substrate with said device isolation films formed on, and processing the first conducting film with a third pattern having a pattern-to-be-removed having on a peripheral edge of the memory cell region as a mask; an insulation film forming step of depositing an insulation film on the semiconductor substrate with the first conducting film formed on, and processing the insulation film with a fourth mask having a pattern covering the memory cell region whose peripheral edge is positioned on said pattern-to-be-removed of the third pattern so that the insulation film covers an edge of the first conducting film; and a gate electrode forming step of depositing a second conducting film on the semiconductor substrate with the insulation film formed on and processing the second conducting film with a mask having a fifth pattern to form a gate electrode of the second conducting film in the peripheral circuit region and a control gate in the memory cell region. By thus fabricating a semiconductor device, the sidewall of the first conducting film is covered with the insulation film and accordingly is not oxidized in a later oxidation step. The first conducting film does not remain as residue.

In the above-described method for fabricating a semiconductor device it is preferable that the second pattern includes a pattern-to-be-removed on a peripheral edge of the memory cell region. By thus fabricating a semiconductor device, no step is formed in another fabrication step near the step formed in the device isolation film, which makes it possible to suppress generation of the residue on the step.

In the above-described method for fabricating a semiconductor device it is preferable that the pattern-to-be-removed of the third pattern is positioned inside the pattern-to-be-removed of the second pattern.

The above-described object is also achieved by a method for fabricating a semiconductor device comprising: a device isolation film forming step of oxidizing a semiconductor substrate with a mask film having a first pattern as a mask to form an oxide film in a device isolation region of a peripheral circuit region and oxidizing the semiconductor substrate with a mask film having a second pattern as a mask to form a first device isolation film which is formed by further oxidizing said oxide film, and a second device isolation film in a memory cell region; a first conducting film forming step of depositing a first conducting film to be a floating gate on the semiconductor substrate with said device isolation films formed on, and processing the first conducting film with a mask having a third pattern whose edge is positioned outside a first region where a pattern-to-be-removed of the first pattern and a pattern-to-be-removed of the second pattern are laid on each other; an insulation film forming step of depositing an insulation film on the semiconductor substrate with the first conducting film formed on and processing the insulation film with a mask having a fourth pattern whose edge is positioned outside the first region; and a gate electrode forming step of deposition a second conducting film on the semiconductor substrate with the insulation film formed on and processing the second conducting film into a fifth pattern to form a gate electrode of the first conducting film in said peripheral circuit region and a control gate in said memory cell region. By thus fabricating a semiconductor device, the sidewall of the first conducting film is covered with the insulation film and accordingly is not oxidized in a later oxidation step. The first conducting film does not remain as residue.

In the above-described method for fabricating a semiconductor device it is preferable that a pattern-to-be-removed of the third pattern is positioned inside a pattern-to-be-left of the fourth pattern. By thus fabricating the semiconductor device, no residue of the insulation film is generated on the sidewall of the first conducting film in the etching step using the fourth pattern. Accordingly generation of particles in later fabricating steps can be prevented.

In the above-described method for fabricating a semiconductor device it is preferable that an edge of the fourth pattern laid on a pattern-to-be-left of the fifth pattern is positioned inside the pattern-to-be-removed of the second pattern. By thus fabricating a semiconductor device, the floating gate and the control gate are not laid on each other on the thick device isolation film in the peripheral circuit region. This facilitates the planarization in a later fabrication step.

The above-described method for fabricating a semiconductor device is applicable to a method for fabricating a semiconductor device in which the insulation film and the first conducting film in the peripheral circuit region are removed in the insulation film forming step.

The above-described method for fabricating a semiconductor device is applicable to a method for fabricating a semiconductor device in which the device isolation film forming step includes the steps of: oxidizing the semiconductor substrate with the mask film having the first pattern as a mask to form the first device isolation film on the semiconductor substrate; removing the mask film; and oxidizing the semiconductor substrate with the mask film having the second pattern as a mask to form on the semiconductor substrate the second device isolation film thinner than the first device isolation film.

DETAILED DESCRIPTION OF THE INVENTION

[A First Embodiment]

The method for fabricating a semiconductor device according to a first embodiment will be explained with reference to FIGS. 1, 2A–2D and 3A–3B.

Figure 1:
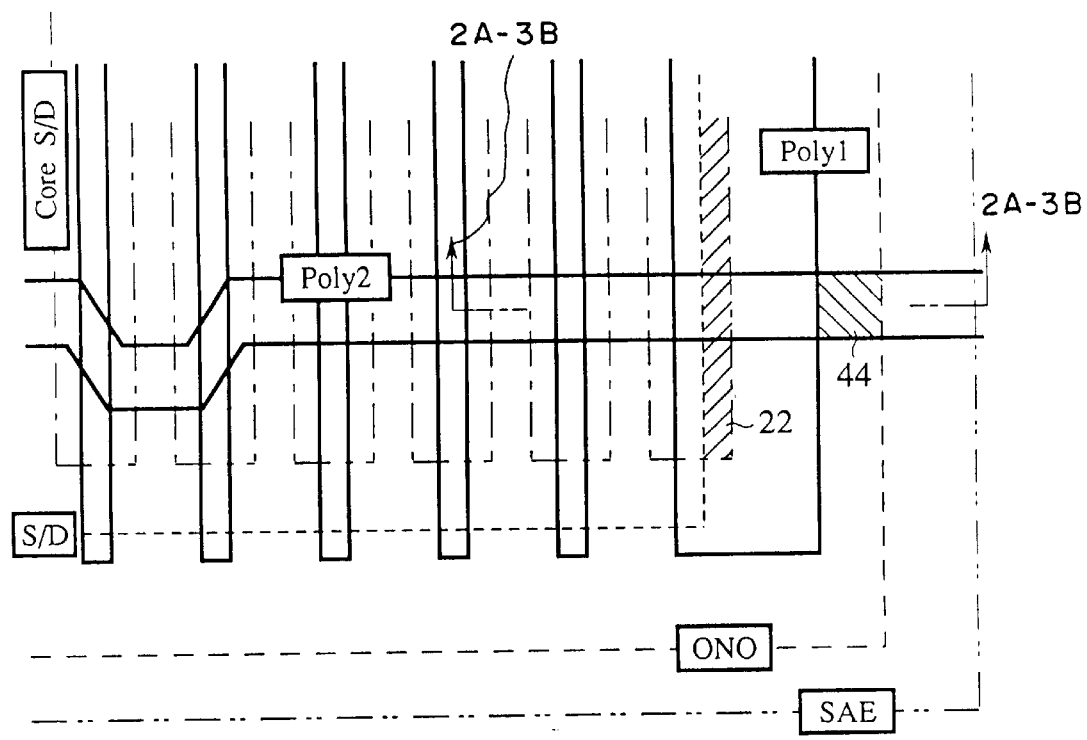
FIG. 1 is a plan view of a mask layout used in the method for fabricating a semiconductor device according to a first embodiment.

FIG. 1 is a plan view of a mask layout of the method for fabricating a semiconductor device according to the present embodiment. FIGS. 2A–2D and 3A–3B are sectional views of the semiconductor device along the line A–A' in the steps of the method for fabricating the same, which explain the method.

Figure 16:
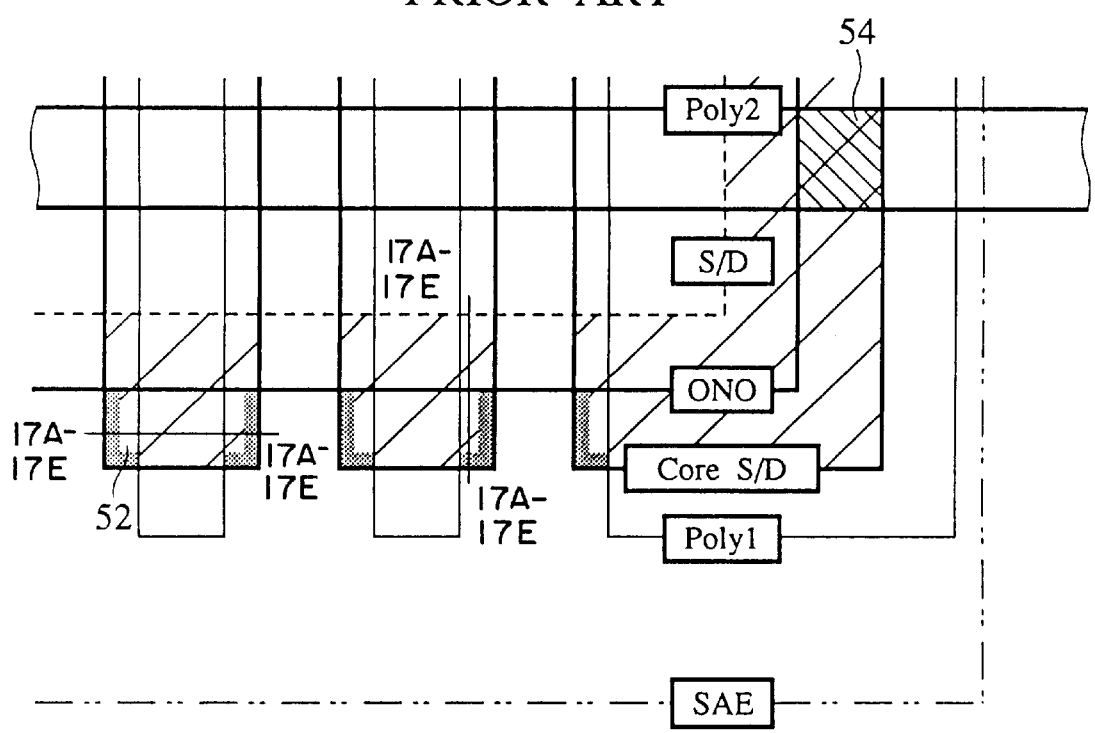
FIG. 16 is a plan view of a mask layout used in the conventional method for fabricating a semiconductor device.
Figure 17A:
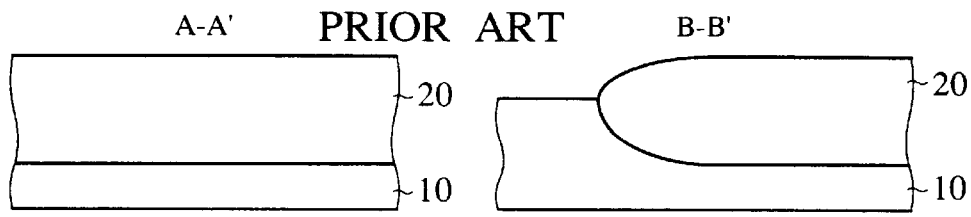
FIGS. 17A–17E are sectional views of a semiconductor device in the steps of the conventional method for fabricating a semiconductor device, which explain the problems of the conventional method.
Figure 17B:
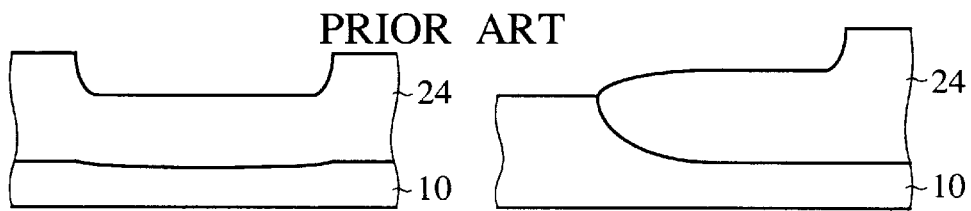
Figure 17C:
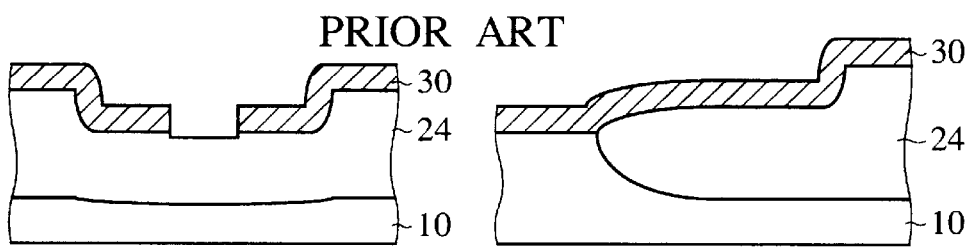
Figure 17D:
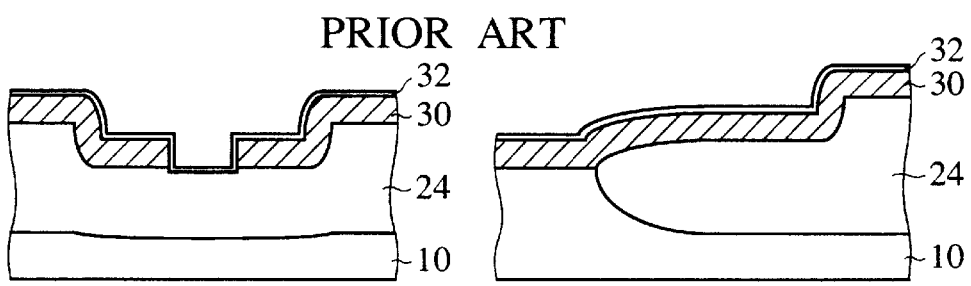
Figure 17E:
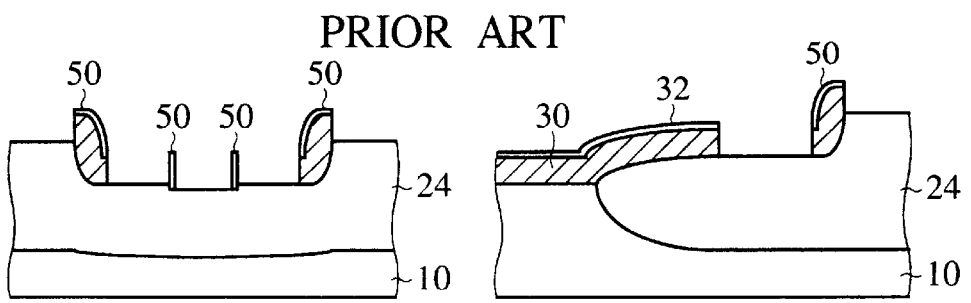
Figure 18:
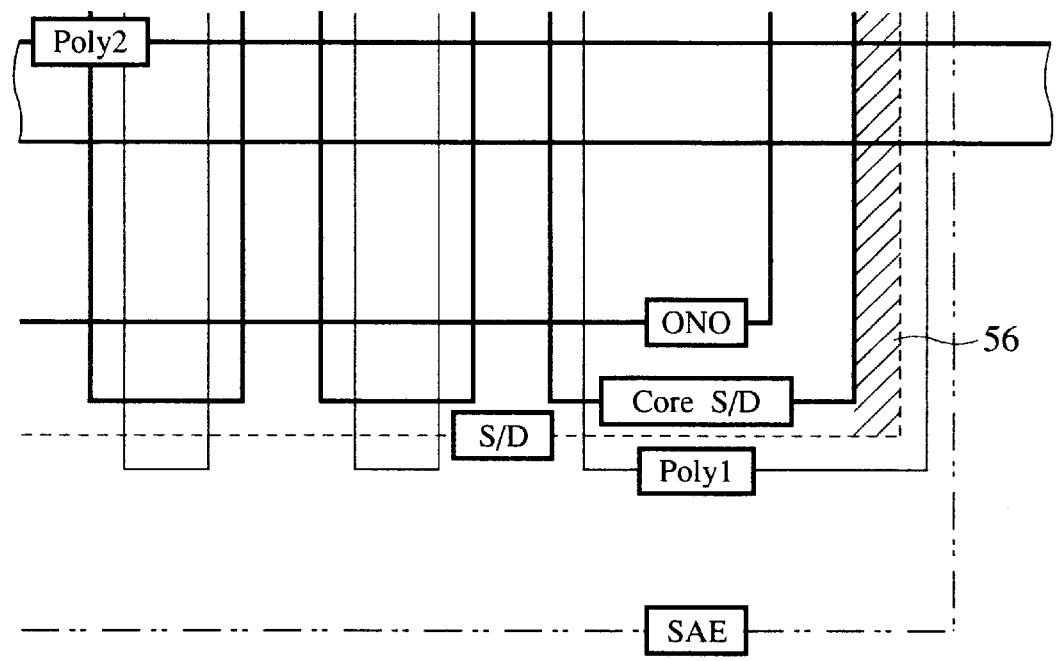
FIG. 18 is a plan view of another mask layout used in the conventional method for fabricating a semiconductor device.

As described above, the conventional method for fabricating a semiconductor device using the mask layout of FIG. 16 has found it difficult to remove the residue in the region 52.

A reason why the residue tends to remain in the region 52 is considered to be that their region has a lower etching rate than the rest region because steps formed by various steps are present in this region, and micronized patterns are formed in this region.

The method for fabricating a semiconductor device according to the present embodiment includes a mask layout which is improved from this viewpoint and is characterized in that the Poly 1 mask and the ONO mask are laid so that no step is formed in another step near the step in the device isolation film, and a pattern-to-be-removed of the Poly 1 mask is laid inside the ONO mask so that the residue of the ONO film on the sidewall of the polycrystalline silicon film formed in the etching step using the SAE mask is not peeled (FIG. 1). The method for fabricating a semiconductor device according to the present embodiment will be detailed in the sequence of the fabrication steps.

First, an about 25 nm-thick pad oxide film 12 is formed on a silicon substrate 10 by thermal oxidation.

Then, an about 170 nm-thick silicon nitride film 14 is deposited on the pad oxide film 12 by CVD method.

Figure 2A:
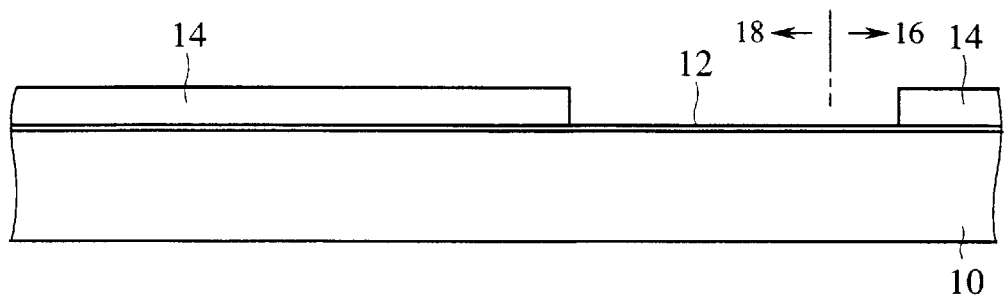
FIGS. 2A–2D are sectional views of a semiconductor device along the line A–A' in FIG. 1 in the steps of the method for fabricating a semiconductor device according to the first embodiment, which explain the method (Part 1).

Subsequently, the silicon nitride film 14 in a region for a thick device isolation film to be formed in is patterned by the usual lithography and dry etching techniques. The silicon nitride film 14 in a region for a thin device isolation film to be formed in is not removed (FIG. 2A).

The S/D mask for patterning the silicon nitride film 14 has a pattern which leaves the silicon nitride film 14 at least in a region which is to be a device region of a memory cell region 18 (FIG. 1).

Then, the silicon substrate 10 is thermally oxidized with the silicon nitride film 14 as a mask to form an about 290 nm-thick oxide film 20.

Next, the silicon nitride film 14 in the memory cell region 18 is patterned by the usual lithography and the dry etching techniques. The silicon nitride film 14 is left only in the region to be the device region.

Figure 2B:
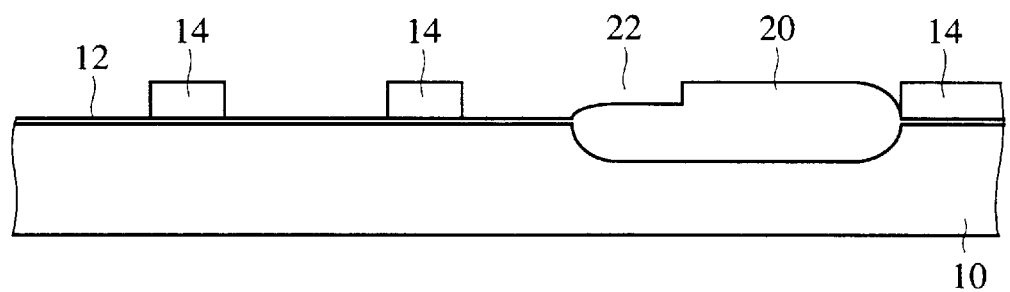

The silicon nitride film 14 in a region 22 is etched at the same time of etching the silicon nitride film 14. Thus an about 120 nm step is formed on the border of the oxide film 22 to the region 22 (FIG. 2B).

The Core S/D mask for patterning the silicon nitride film 14 is laid with a pattern-to-be-removed (a region for a thin device isolation film to be formed in) except a region for a control gate 36 which will be formed in a later step to be extended in located inside the S/D mask (FIG. 1). The S/D mask and the pattern-to-be-removed of the Core S/D mask are laid on each other in the region 22 for the control gate 36 to be extended in is because when the device region is formed in a region without the polycrystalline silicon film to be the floating gate, there is a risk that the silicon substrate may be dug in a later step with results of large junction leak current, etc. (see FIG. 16).

In the specification, the "pattern-to-be-removed" means a region where a resist is to be removed in a lithography step, and a "pattern-to-be-left" means a region where a resist is to be left.

Subsequently the silicon substrate 10 is thermally oxidized with the silicon nitride film 14 as a mask. This oxidation forms the device isolation film 26 in an about 250 nm-thick in the memory cell region 18, and, in a peripheral circuit region 16, further oxidizes the oxide film 20 to form the device isolation film 24 in an about 400 nm-thick.

Figure 2C:
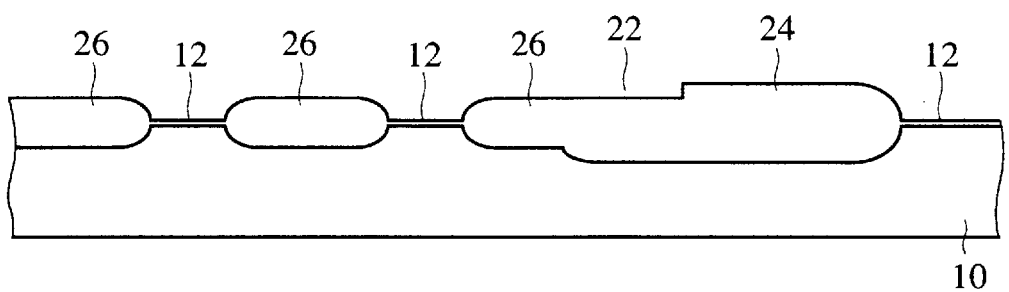

Then, the silicon nitride film 14, which has been used as the oxidation mask (FIG. 2C).

Then, the pad oxide film 12 is removed, and an about 10 nm-thick tunnel oxide film 28 is formed by thermal oxidation in the device region defined by the device isolation film 26.

Subsequently an about 110 nm-thick polycrystalline silicon film 30 is deposited. The polycrystalline silicon film 30 is a conducting film to be the floating gate.

Figure 2D:
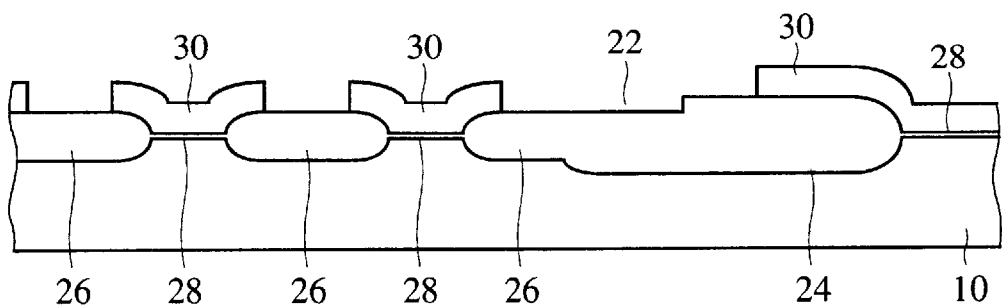

Then, the polycrystalline silicon film 30 is processed into a prescribed pattern by the usual lithography and the etching (FIG. 2D).

The Poly 1 mask for patterning the polycrystalline silicon film 30 is laid so as to separate the floating gates of memory cell transistors arranged in the direction of extension of a word line (the control gate 36) from each other. In the semiconductor device shown in FIG. 1, the Poly 1 mask is laid so that a pattern-to-be-removed of the Poly 1 mask for the polycrystalline silicon film 30 is extended on the stripe-shaped device isolation film 26. A pattern-to-be-removed of the Poly 1 mask is laid on the region 22 so that no residue takes place on the step at the border of the region 22 in a later fabrication step (FIG. 1). The polycrystalline silicon film 30 in the peripheral circuit region 16 is not patterned so that the polycrystalline silicon film 30 covers the entire peripheral circuit region 16.

Then, the ONO film 32 of an about 7 nm-thick bottom oxide film an abut 10 nm-thick silicon nitride film and an about 3 nm-thick top oxide film which are laid in the stated order is deposited. The ONO film 32 is an insulation film for capacitive coupling between the floating gate and the control gate.

Figure 3A:
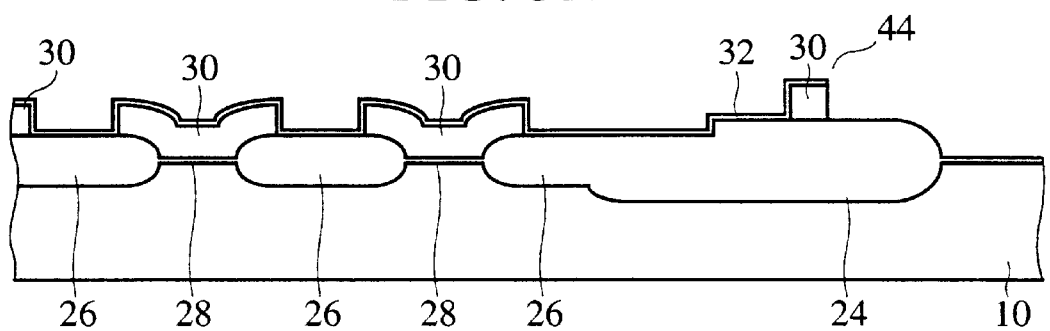
FIGS. 3A and 3B are sectional views of a semiconductor device along the line A–A' in FIG. 1 in the steps of the method for fabricating a semiconductor device according to the first embodiment, which explain the method (Part 2).

Subsequently, the ONO film 32 and the polycrystalline silicon film 30 in the peripheral circuit region 16 are removed by the usual lithography and dry etching techniques (FIG. 3A).

The ONO mask for patterning the ONO film 32 and the polycrystalline silicon film 30 can have a pattern which covers substantially the entire memory cell region 18.

It is preferable that the pattern-to-be-removed of the POLY 1 mask is positioned inside the ONO mask. This is because in etching the ONO film 32 by the use of the ONO mask with the pattern-to-be-removed of the Poly 1 mask positioned outside the ONO mask, it is difficult to remove the ONO film 32 formed on the sidewall of the polycrystalline silicon film 30.

In the present embodiment, the polycrystalline silicon film 30 in the peripheral circuit region 16 is not etched in patterning the polycrystalline silicon film 30 by the use of the Poly 1 mask, and is removed at the same time of removing the ONO film 32 in the peripheral circuit region 16. This is because the ONO film 32 is removed without damaging the silicon substrate 10.

In a case that the ONO film 32 is used only in the memory transistor and is not used in the transistor for a peripheral circuit, it is necessary to remove the ONO film 32 in the peripheral circuit region. Here, the ONO film 32 in the peripheral circuit is formed on the thin silicon oxide film formed at the same time of forming the tunnel oxide film 28, and because it is difficult to secure an etching selective ratio between the ONO film 32 and the silicon oxide film, there is a risk that the silicon oxide substrate 10 may be damaged when the ONO film 32 is removed.

In the region where the ONO film 32 and the polycrystalline silicon film 30 are etched the peripheral edge of the patterned polycrystalline silicon film 30 is absent, and the ONO film 32 is etched without remaining on the sidewall of the polycrystalline silicon film 30.

Then, the silicon oxide film which is to be a gate insulation film 34 of the transistor for a peripheral circuit is formed. The silicon oxide film of, e.g., an about 15 nm-thick is formed as the gate insulation film 34 by thermal oxidation.

Then, an about 120 nm-thick polycrystalline silicon film, an about 150 nm-thick tungsten silicide film and an about 90 nm-thick silicon oxynitride film (SiON film) are deposited on the entire surface in the stated order by CVD method. The polycrystalline silicon film and the tungsten silicide film are conducting films forming the gate electrode of polycide (silicide/polycrystalline silicon) structure. The silicon oxynitride film is a mask film for processing the floating gate in a later step.

Subsequently, the laminated film of the silicon oxynitride film, the tungsten silicide and the polycrystalline silicon film is patterned by the usual lithography and dry etching techniques to form the control gate 36 in the memory cell region 18 and the gate electrode 38 in the peripheral circuit region 16.

The Poly 2 mask used in patterning the control gate 36 and the gate electrode 38 can be laid suitably in accordance with a device structure, and the present embodiment is not limited by a layout of the Poly 2 mask.

Figure 3B:
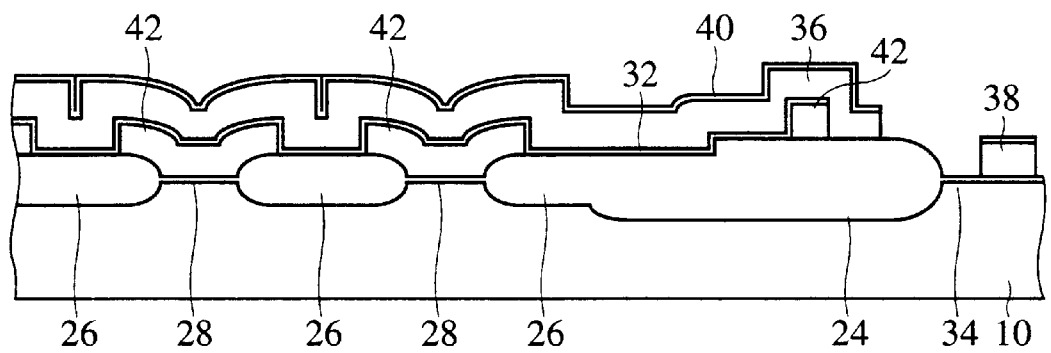

Then, a photoresist for covering the peripheral circuit region 16 is formed, and the ONO film 32 and the polycrystalline silicon film 30 in the memory cell region 16 are etched with the control gate 36 as a mask. In etching the ONO film 32 and the polycrystalline silicon film 30, the control gate 36, which is covered with a mask film of silicon oxynitride film is not etched. Thus, the floating gate 42 formed below the control gate 36 below the ONO film 32 is formed in alignment with the control gate 36 (FIG. 3B).

Preferably the SAE mask for patterning the floating gate 42 is laid at least with the memory cell region opened larger than a region covered with the ONO mask because the unnecessary ONO film 32 and polycrystalline silicon film 30 in the memory cell region 18 must be removed.

By thus fabricating the semiconductor device including the floating gate the residue generated in the step can be easily removed, and the generation of particles can be prevented.

As described above, According to the present embodiment, the Poly 1 mask and the ONO mask are laid so that a step is not formed in another fabrication step near the step formed in the device isolation film 24, whereby residue of the ONO film 32 and polycrystalline silicon film 30 can be easily removed by overetching.

The Poly 1 mask-to-be-removed is positioned inside the ONO mask, whereby the ONO film 32 is not left on the sidewall of the polycrystalline silicon film 30 by the etching using the ONO mask. This prevents residue of the ONO film 32 formed on the sidewall of the polycrystalline silicon film 30 in the step of etching using the SAE mask.

[A Second Embodiment]

The method for fabricating a semiconductor device according to a second embodiment of the present invention will be explained with reference to FIGS. 4 to 9. The same members of the present embodiment as those of the method for fabricating a semiconductor device are represented by the same reference numbers not to repeat or to simplify their explanation.

Figure 4:
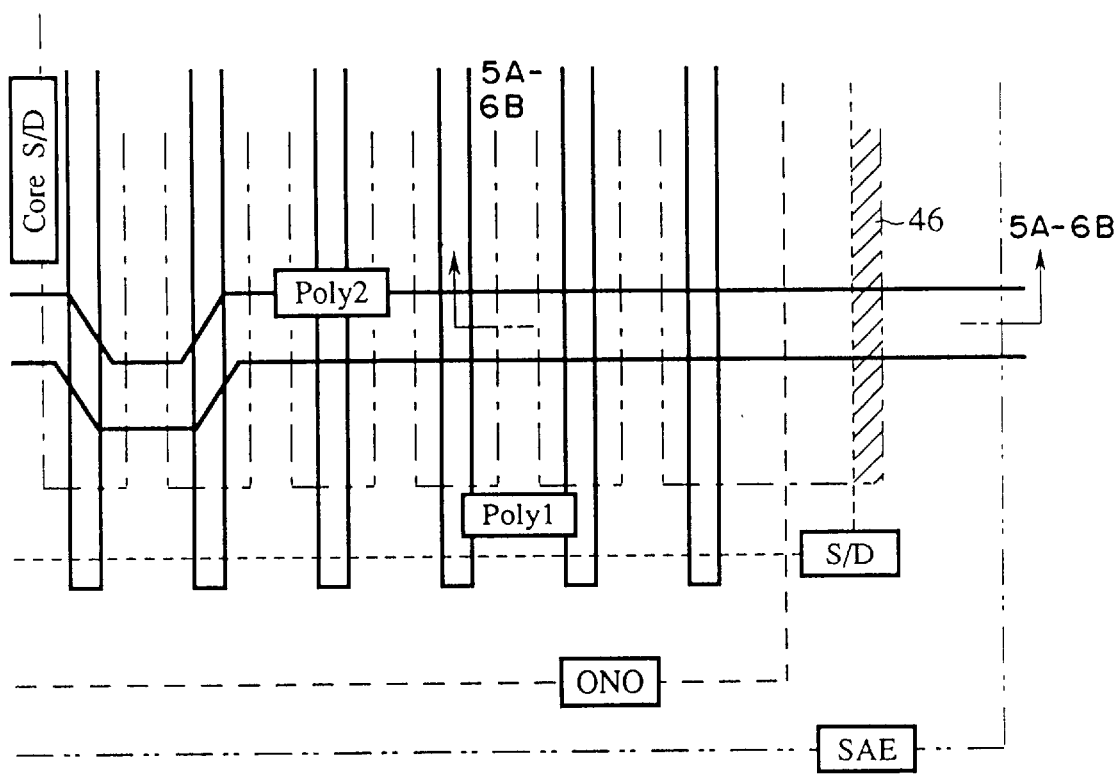
FIG. 4 is a plan view of a mask layout used in the method for fabricating a semiconductor device according to a second embodiment of the present invention.

FIG. 4 is a plan view of a mask layout used in the method for fabricating a semiconductor device according to the present embodiment. FIGS. 5A–5C and 6A–6B are sectional views of the semiconductor device along the line A–A' in FIG. 4 in the steps of the method for fabricating a semiconductor device, which show the method. FIG. 7 is a plan view of a mask layout used in one modification of the method for fabricating a semiconductor device according to the present embodiment. FIGS. 8A–8C and 9A–9B are sectional views of the semiconductor device in the steps of the modification along the line A–A' in FIG. 7, which show the modification.

In the method for fabricating a semiconductor device according to the first embodiment, the Poly 1 mask and the ONO mask are laid so that a step is not formed in another step near the step formed in the device isolation film 24, whereby residue of the ONO film 32 and the polycrystalline silicon film 30 formed on the step can be easily removed by overetching.

However, when the layout of FIG. 1 is used, the floating gate 42 is formed below the control gate 36 in the region 44, and further therebelow the thick device isolation film 24 is formed.

Thus the region 44 is the highest region on the silicon substrate 10, and is a restricted region in a later planarization step.

In the method for fabricating a semiconductor device according to the present embodiment, no region where the control gate 36 and the floating gate 42 overlap each other is formed on the thick device isolation film 24.

The method for fabricating a semiconductor device according to the present embodiment is characterized in that a pattern of the S/D mask is extended to the outside of the ONO mask in a region in a peripheral circuit region where the control gate 36 is extended so that the floating gate 42 is not formed between the device isolation film 24 and the control gate 36 (FIG. 4).

The fabrication steps of the method for fabricating a semiconductor device according to the present embodiment will be detailed.

Figure 5A:
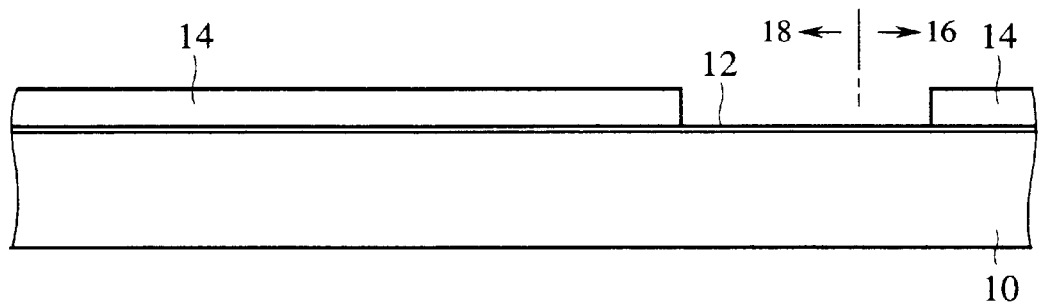
FIGS. 5A–5C are sectional views of a semiconductor device along the line A–A' in FIG. 4 in the steps of the method for fabricating a semiconductor device according to the second embodiment, which explain the method (Part 1).
Figure 5B:
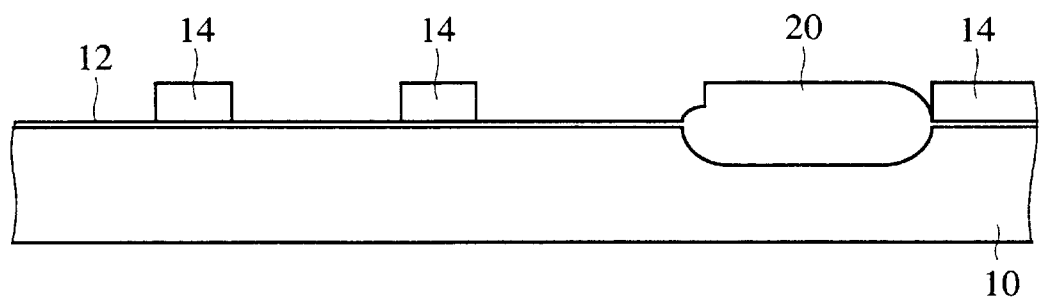
Figure 5C:
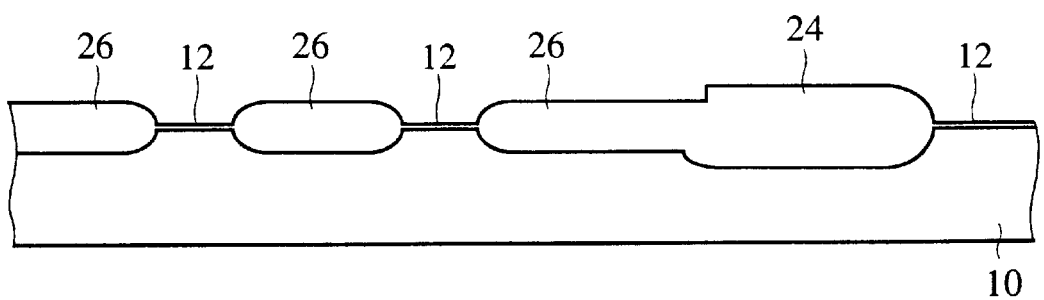

First, the thick device isolation film 24 and the thin device isolation 26 are formed in the same way as in the method for fabricating a semiconductor device according to the first embodiment shown in FIG. 2A to 2C to define a device region on a silicon substrate 10 (FIG. 5A to C).

Next, a pad oxide film 12 is removed, and an about 10 nm-thick tunnel oxide film 28 is formed by thermal oxidation in the region defined by the device isolation film 26.

Subsequently, an about 110 nm-thick polycrystalline silicon film 30 is deposited. The polycrystalline silicon film 30 is a conducting film for forming the floating gate.

Figure 6A:
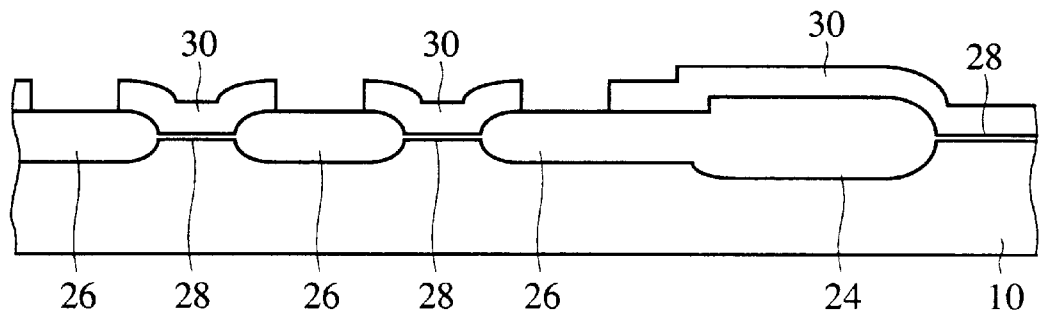
FIGS. 6A and 6B are sectional views of a semiconductor device along the line A–A' in FIG. 4 in the steps of the method for fabricating a semiconductor device according to the second embodiment, which explain the method (Part 2).
Figure 7:
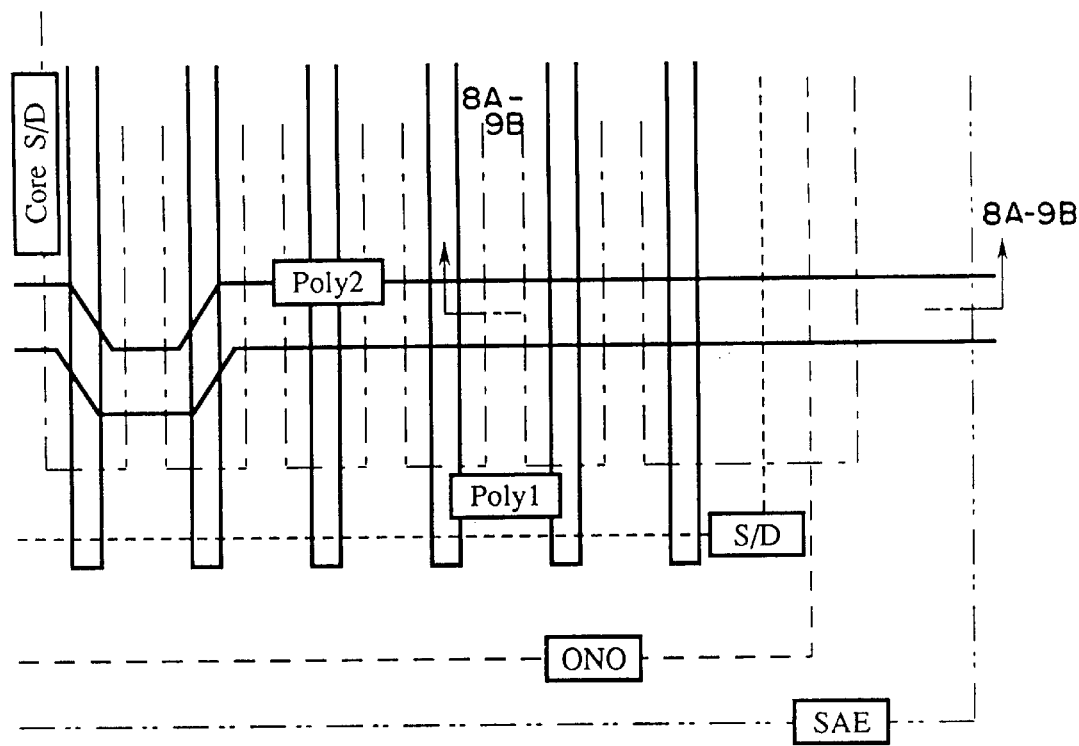
FIG. 7 is a plan view of a mask layout used in the method for fabricating a semiconductor device according to one modification of the second embodiment of the present invention.
Figure 8A:
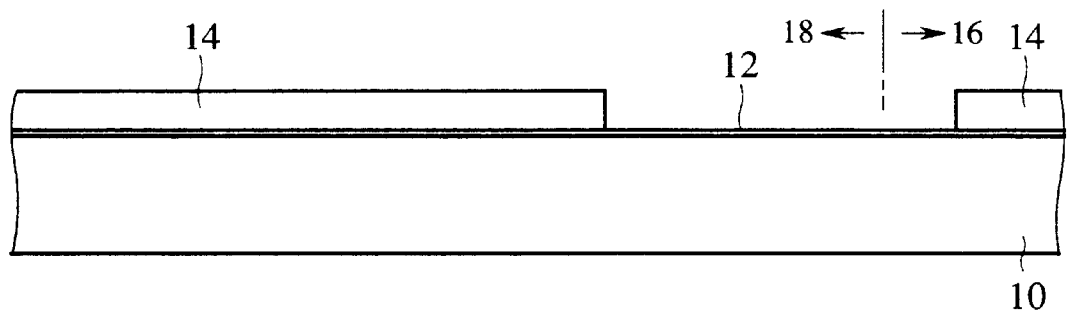
FIGS. 8A–8C are sectional views of a semiconductor device along the line A–A' in FIG. 7 in the steps of the method for fabricating a semiconductor device according to the modification, which explain the method (Part 1).
Figure 8B:
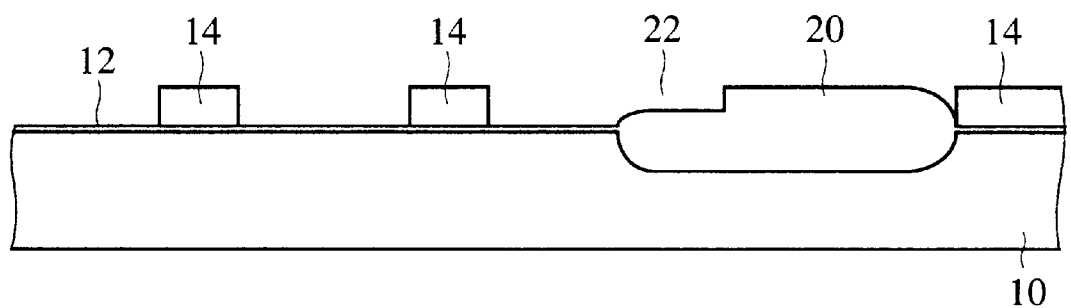
Figure 8C:
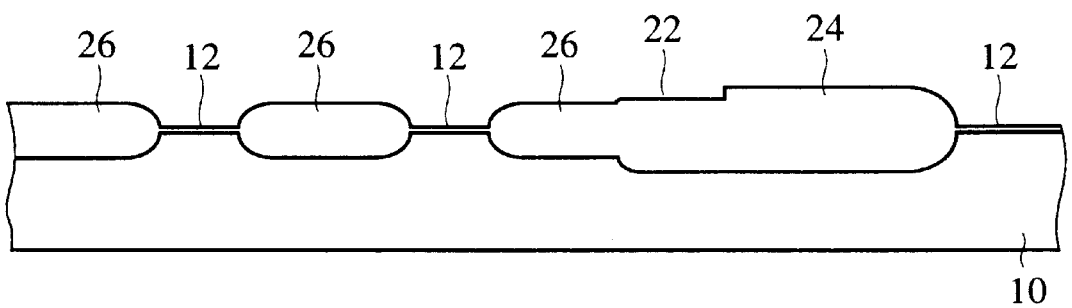
Figure 9A:
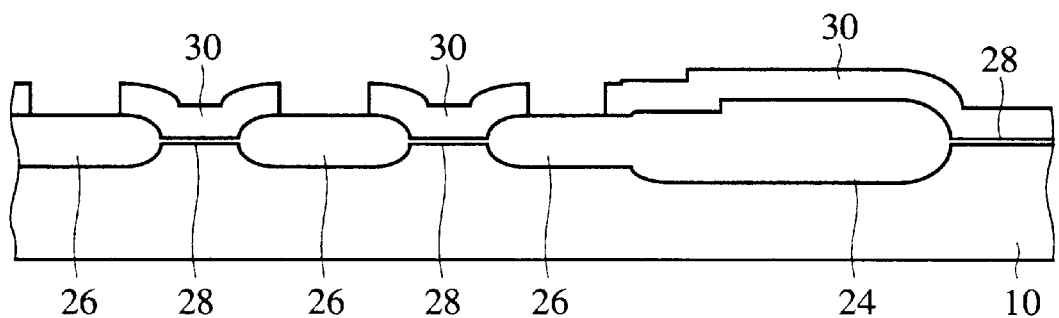
FIGS. 9A and 9B are sectional views of a semiconductor device along the line A–A' in FIG. 7 in the steps of the method for fabricating a semiconductor device according to the modification, which explain the method (Part 2).
Figure 9B:
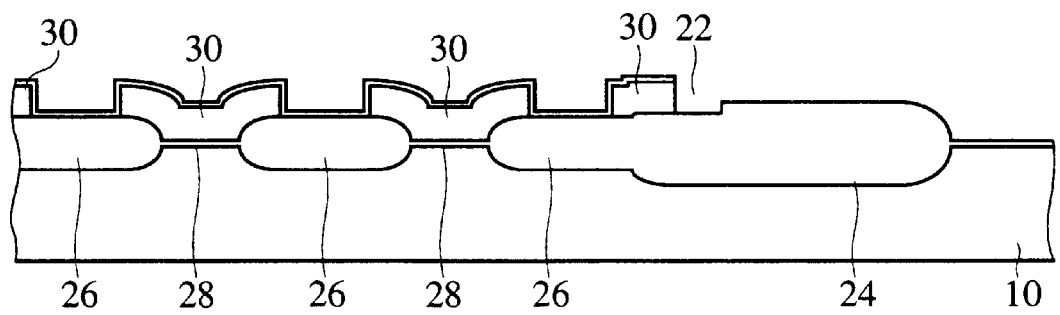

Then, the polycrystalline silicon film 30 is processed in a prescribed pattern by the usual lithography and etching techniques (FIG. 6A).

The Poly 1 mask for patterning the polycrystalline silicon film 30 is laid so as to separate the floating gates of memory cell transistors arranged in the direction of extension of a word line (the control gate 36) from each other. In the semiconductor device shown in FIG. 4, the Poly 1 mask is laid so that a pattern-to-be-removed of the Poly 1 mask for the polycrystalline silicon film 30 is extended on the stripe-shaped device isolation film 26 (FIG. 4). The polycrystalline silicon film 30 in the peripheral circuit region 16 is not patterned so that the polycrystalline silicon film 30 covers the entire peripheral circuit region 16.

Then, the ONO 32 of an about 7 nm-thick bottom oxide film an abut 10 nm-thick silicon nitride film and an about 3 nm-thick top oxide film which are laid in the stated order is deposited. The ONO film 32 is an insulation film for capacitive coupling between the floating gate and the control gate.

Figure 6B:
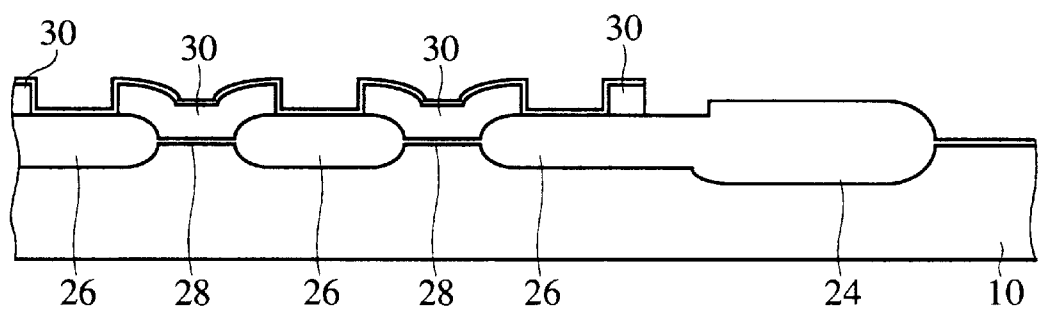

Subsequently, the ONO film 32 and the polycrystalline silicon film 30 in the peripheral circuit region 16 are removed by the usual lithography and dry etching techniques (FIG. 6B).

The ONO mask for patterning the ONO film 32 and the polycrystalline silicon film 30 are patterned so as to be positioned inner of the S/D mask in the region where at least the control gate 36 is extended, so that the floating gate 42 is not left between the device isolation film 24 and the control gate 36.

With the layout of FIG. 4 used, when the ONO film 32 and the polycrystalline silicon film 30 are etched, there is a risk that the ONO film 32 and the polycrystalline silicon film 30 may be left on a step in the region 46. However, in the method for fabricating a semiconductor device according to the present embodiment, a step alone formed when the silicon nitride film 14 is patterned is present, and no step is formed near said step in, e.g., the step of etching the polycrystalline silicon film 30 by the use of the Poly 1 mask, the step of etching the ONO film 32 and the polycrystalline silicon film 30 by the use of the ONO mask, and other steps. Accordingly, the residue can be easily removed in comparison with the conventional method for fabricating a semiconductor device shown in FIG. 16. Thus, the residue can be removed with less overetching, which can suppress wear of the device isolation film 24.

Subsequently, in the same way as in the method for fabricating a semiconductor device according to the first embodiment shown in FIG. 3B, the control gate 36 is formed in the memory cell region 18, and the gate electrode 38 is formed in the peripheral circuit region 16.

By this layout of the patterns, the structure of the floating gate 42 and the control gate 36 laid on each other is not formed on the device isolation film 24, which facilitates the planarization in a later step.

As described above, according to the present embodiment, a pattern of the S/D mask is extended to the outside of the ONO mask in the region in the peripheral circuit region 16 where the control gate 36 is extended, whereby the floating gate 42 is not formed between the device isolation film 24 and the control gate 36. This facilitates the planarization in a later step.

In the layout for the semiconductor device shown in FIG. 4, the edge of the pattern of the S/D mask is extended to the outside of the ONO mask, but at least the pattern of the Core S/D mask is located outside the pattern of the ONO mask, whereby the same effect produced by the present embodiment can be produced. Accordingly, as exemplified in FIG. 7, the edge of the pattern of the ONO mask can be located between the pattern of the Core S/D mask and the pattern of the S/D mask.

In this case, in the same way as in the method for fabricating a semiconductor device shown in FIGS. 2A to FIG. 3A, the polycrystalline silicon film 30 and the ONO film 32 are formed, and the ONO film 32 and the polycrystalline silicon film 30 are patterned by the use of the ONO mask, whereby the polycrystalline silicon film 30 remains in the region 22 (FIGS. 8A to FIG. 9B). However, the device isolation film in the region 22 is thinner than the thick device isolation film 24, which facilitates the planarization in a later step in comparison with the method for fabricating a semiconductor device according to the first embodiment.

[A Third Embodiment]

The method for fabricating a semiconductor device according to a third embodiment will be explained with reference to FIGS. 10, 11A–11D, 12A–12C, 13, 14A–D and 15A–C. The same members of the present embodiment as those of the method for fabricating a semiconductor device according to the first or the second embodiment are represented by the same reference numbers not to repeat or to simplify their explanation.

Figure 10:
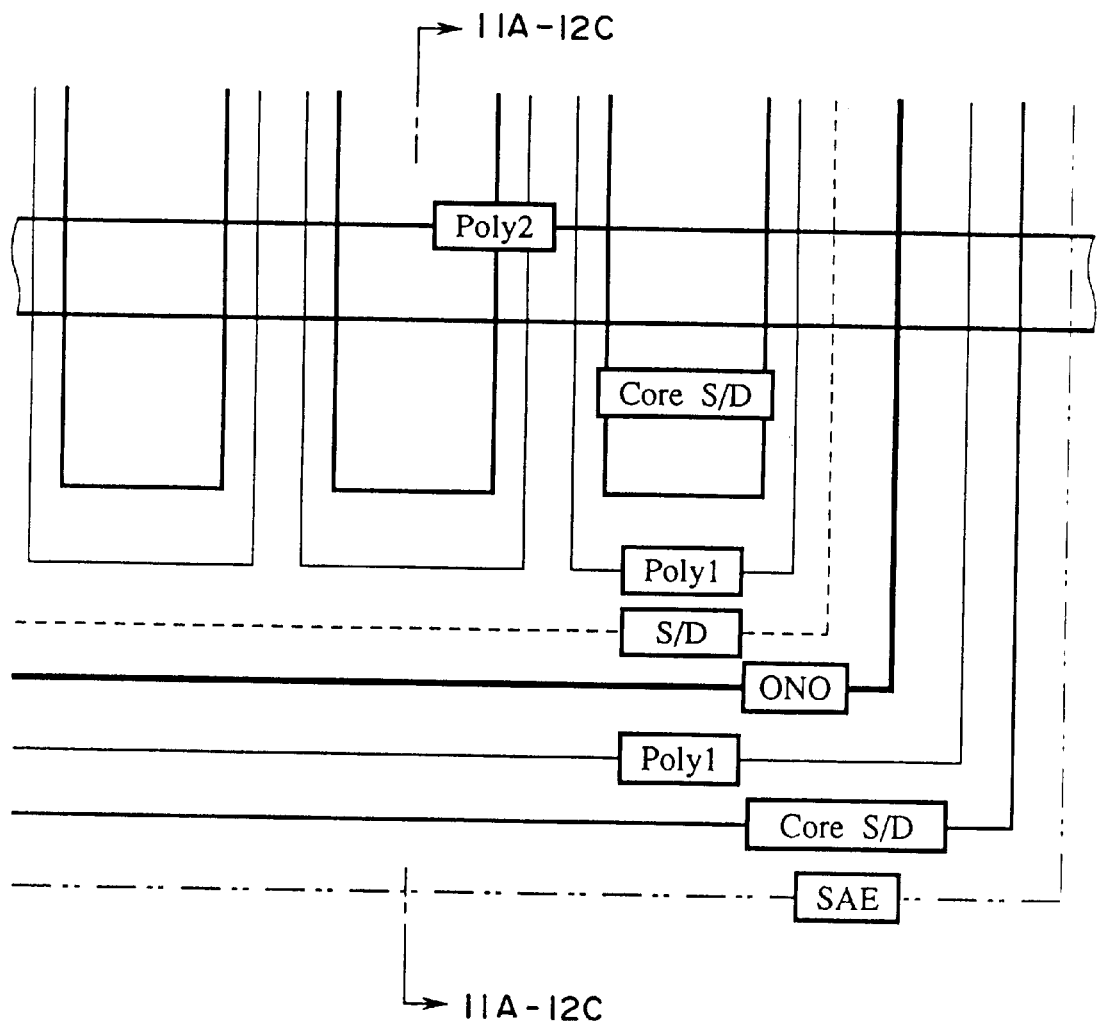
FIG. 10 is a plan view of a mask layout used in the method for fabricating a semiconductor device according to a third embodiment of the present invention.

FIG. 10 is a plan view of a mask layout used in the method for fabricating a semiconductor device according to the present embodiment. FIGS. 11A–11D and 12A–12C are sectional views of the semiconductor device along the line A–A' in FIG. 10 in the steps of the method for fabricating a semiconductor device according to the present embodiment, which show the method. FIG. 13 is a plan view of a mask layout used in one modification of the method for fabricating a semiconductor device according to the present embodiment. FIGS. 14A–14D and 15A–15C are sectional views of the semiconductor device in the steps of the modification along the line A–A' in FIG. 13, which show the modification.

In the method for fabricating a semiconductor device according to the first or the second embodiment, after the ONO film 32 and the polycrystalline silicon film 30 are patterned by the use of the ONO mask, the polycrystalline silicon film 30 is exposed on the sidewall (see e.g., the region 44 in FIG. 3A).

However, with the polycrystalline silicon film 30 exposed on the sidewall, in a later oxidation step (e.g., the step of forming the gate insulation film of the peripheral circuit transistors) oxidation occurs at the interface between the polycrystalline silicon film 30 and the ONO film 32, and the ONO film 32 is formed thick along the peripheral edge of the ONO mask.

With the ONO film 32 thus formed thick, ONO film 32 cannot be sufficiently removed when the ONO film 32 is removed by the use of the SAE mask, and there is a risk that the lower polycrystalline silicon film 30 may remain as residue.

In the method for fabricating a semiconductor device according to the present embodiment, the residue is not formed on the peripheral edge of a pattern of the ONO mask.

The method for fabricating a semiconductor device according to the present embodiment is characterized in that a pattern-to-be-removed of the Poly 1 mask is laid along the peripheral edge of a pattern of the ONO mask so that the polycrystalline silicon film 30 is not present on the peripheral edge of the ONO mask.

The method for fabricating a semiconductor device according to the present embodiment is also characterized in that the peripheral edge of a pattern of the Core S/D mask is positioned outside the peripheral edge of a pattern of the Poly 1 mask so that near a step formed in a device isolation film 24 no step is formed in another step (FIG. 10).

Thus, in the method for fabricating a semiconductor device according to the present embodiment, the pattern-to-be-removed of the Poly 1 mask and a pattern-to-be-removed of the Core S/D mask are laid so as to surround a memory cell region. The method for fabricating a semiconductor device according to the present embodiment will be explained in the sequence of the fabrication steps thereof.

Figure 11A:
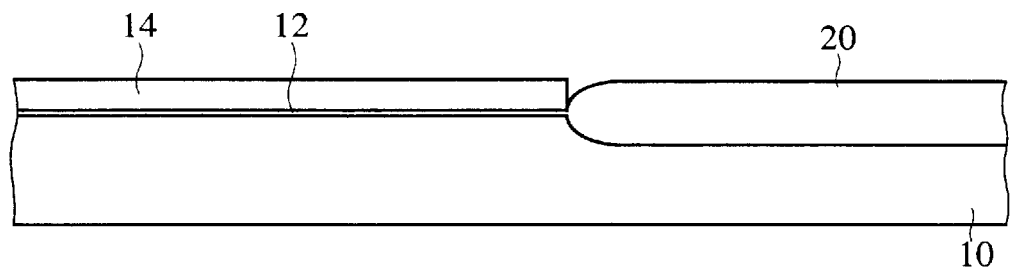
FIGS. 11A–11D are sectional views of a semiconductor device along the line A–A' in FIG. 10 in the steps of the method for fabricating a semiconductor device according to the third embodiment, which explain the method (Part 1).

First, in the same way, for example, as in the method for fabricating a semiconductor device according to the first embodiment, an about 290 nm-thick oxide film 20 is formed in the peripheral circuit region 16. (FIG. 11A).

Figure 11B:
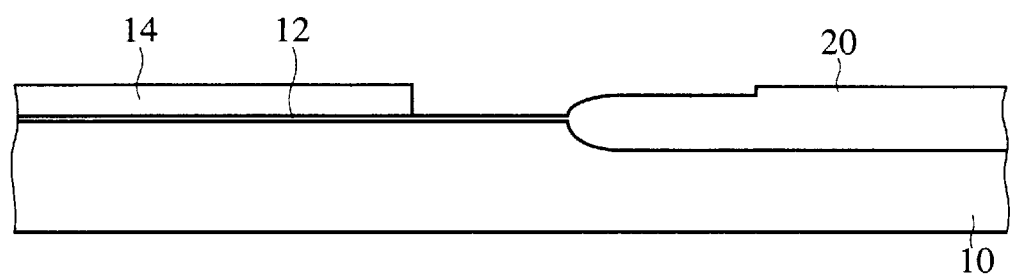

Next, the silicon nitride film 14 in the memory cell region 20 is patterned by the usual lithography and dry etching (FIG. 11B).

The core S/D mask for patterning the silicon nitride film 14 is laid so that a pattern-to-be-removed of the Core S/D mask is formed in the peripheral edge of the memory cell region 16. A pattern-to-be-left corresponding to a memory cell structure is formed in the pattern-to-be-removed. In the semiconductor device shown in FIG. 10, the pattern-to-be-left, which is to be a memory cell region is stripe-shaped.

Subsequently, the silicon substrate 10 is thermally oxidized with the silicon nitride film 14 as a mask. This oxidation forms the device isolation film 26 in an about 250 nm-thick in the memory cell region 18, and further oxidizes the oxide film 20 in the peripheral circuit region 16 to form the device isolation film 24 in an about 400 nm-thick.

Then, the silicon nitride film 14 used as the oxidation mask is removed.

Next, the pad oxide film 12 is removed, and the tunnel oxide film 28 is formed by another thermal oxidation in an about 10 nm-thick in the device region defined by the device isolation film 26.

Subsequently, the polycrystalline silicon film 30 is deposited in an about 110 nm-thick. The polycrystalline silicon film 30 is a conducting film forming the floating gate.

Figure 11C:
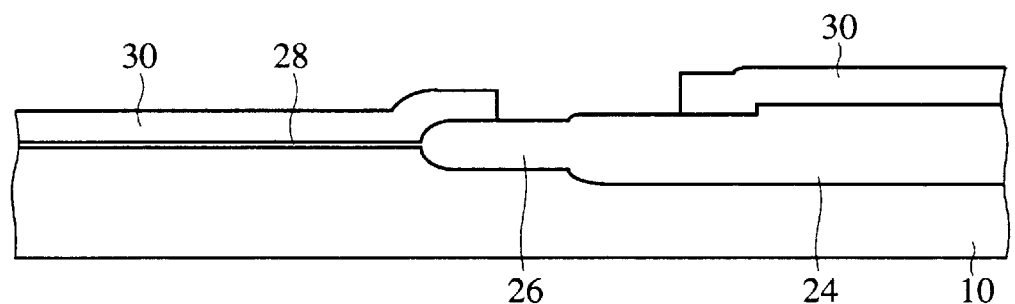

Then, the polycrystalline silicon film 30 is processed into a prescribed pattern by the usual lithography and etching (FIG. 11C).

A pattern-to-be-removed of the Poly 1 mask for patterning the polycrystalline silicon film 30, which surrounds the peripheral edge of the memory cell region is laid inside the Core S/D mask. A pattern-to-be-left corresponding to a memory cell structure is formed in the pattern-to-be-removed. In the semiconductor device shown in FIG. 10, the patter-to-be-left is a stripe shape covering the stripe-shaped device region. The polycrystalline silicon film 30 in the peripheral circuit region 16 is not patterned, and the entire peripheral circuit region 16 is covered with the polycrystalline silicon film 30.

Figure 11D:
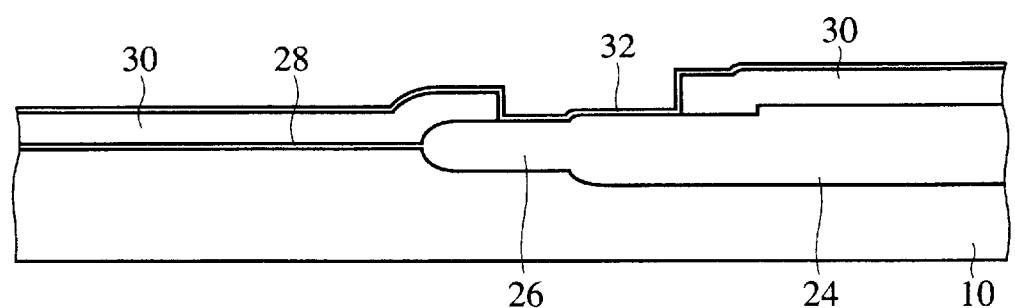

Then the ONO film 32 formed of an about 7 nm-thick bottom oxide film, an about 10 nm-thick silicon nitride film and an about 3 nm-thick top oxide film laid one on another is deposited (FIG. 11D).

Figure 12A:
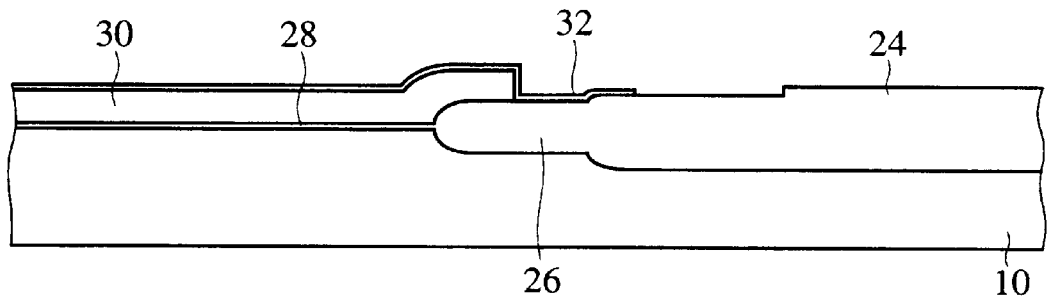
FIGS. 12A–12C are sectional views of a semiconductor device along the line A–A' in FIG. 10 in the steps of the method for fabricating a semiconductor device according to the third embodiment, which explain the method (Part 2).
Figure 13:
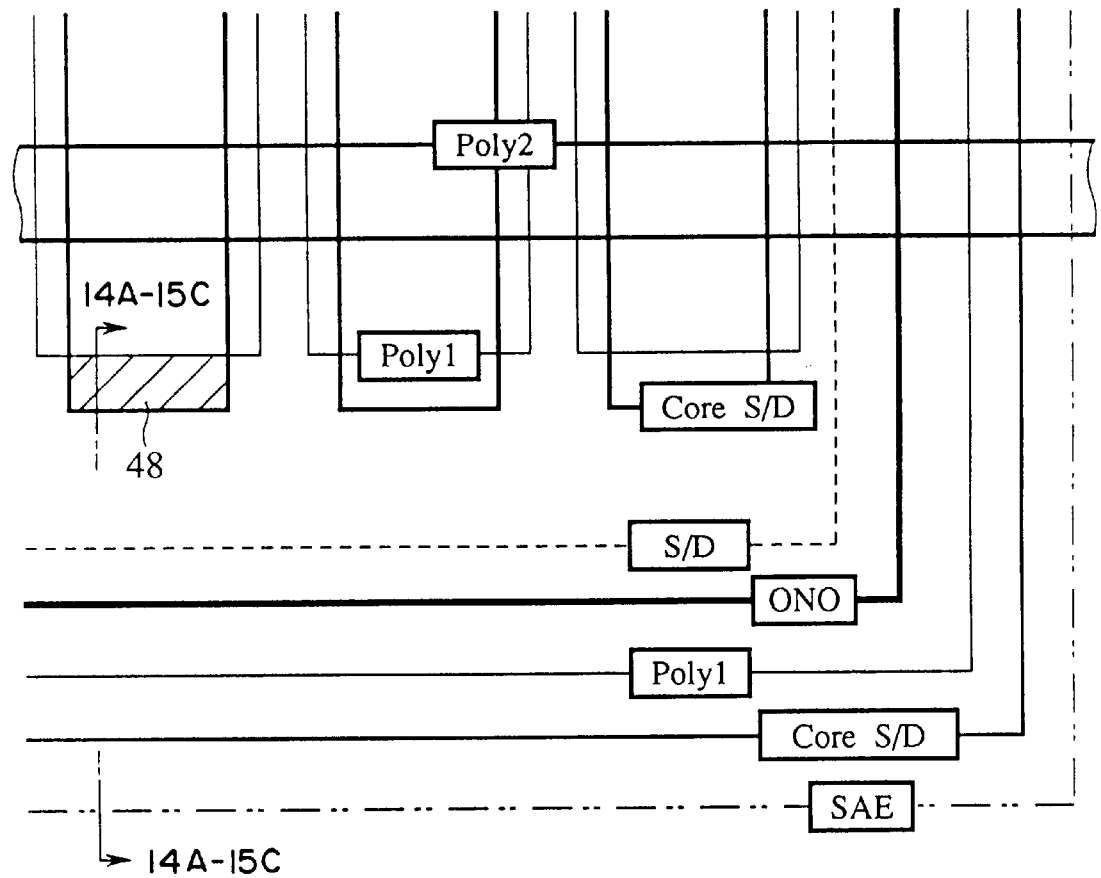
FIG. 13 is a plan view of a mask layout used in the method for fabricating a semiconductor device according to one modification of the third embodiment of the present invention.

Subsequently, the ONO film 32 and the polycrystalline silicon film 30 in the peripheral circuit region 16 are removed by the usual lithography and dry etching techniques (FIG. 12A).

The ONO mask for patterning the ONO film 32 and the polycrystalline silicon film 30 is laid so that the peripheral edge of a pattern is located within a pattern-to-be-removed of the Poly 1 mask.

By laying the ONO mask, the sidewall of the polycrystalline silicon film 30 is not exposed on the peripheral edge of the ONO mask, and accordingly the ONO film 32 is not thickened in a later oxidation step.

There is a risk that in etching the ONO film 32 and the polycrystalline silicon film 30, because of a step formed on the border of the device isolation film 24 to the region 22, residue of the ONO film and the polycrystalline silicon film 30 may remain on the step. In the method for fabricating a semiconductor device according to the present embodiment, the step alone formed in removing the silicon nitride film 18 is present, which facilitates removal of the residue in comparison with that in the conventional method for fabricating a semiconductor device. Thus, the residue can be removed with less overetching, which can suppress wear of the device isolation film 24.

Because of the step of the polycrystalline silicon film 30 outside a pattern-to-be-removed of the Poly 1 mask, there is a risk that the ONO film 32 formed on the sidewall of the polycrystalline silicon film 30 may remain as residue, but the residue can be removed with less overetching because no step is formed in this region by another step.

Then, the silicon oxide film to be the gate insulation film of a transistor of a peripheral circuit (not shown) is formed.

Next, an about 120 nm-thick polycrystalline silicon film, an about 150 nm-thick tungsten silicide film and an about 90 nm-thick silicon oxynitride film are deposited in the stated order by, e.g., CVD method. The polycrystalline silicon film and the tungsten silicide film are conducting films forming the gate electrode of polycide structure. The silicon oxynitride film is a mask film for processing the floating gate in a later step.

Figure 12B:
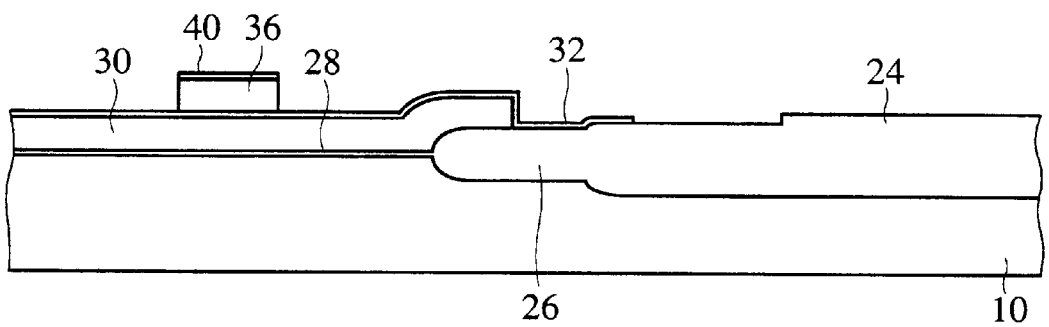

The laminated film of the silicon oxynitride film, the tungsten silicide film and the polycrystalline silicon film is patterned by the usual lithography and dry etching techniques to form the control gate 36 in the memory cell region 18 and the gate electrode (not shown) in the peripheral circuit region 16 (FIG. 12B).

Figure 12C:
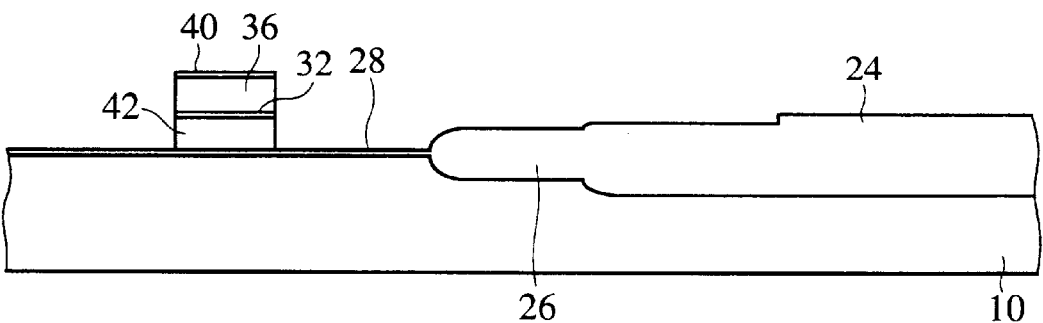

Then, a photoresist for covering the peripheral circuit region 16 is formed, and the ONO film 32 and the polycrystalline silicon film 30 in the memory cell region 16 are etched with the control gate 36 as a mask. In etching the ONO film 32 and the polycrystalline silicon film 30, the control gate 36 is not etched because the control gate 36 is covered with the mask 40 of the silicon oxynitride film. Thus, the floating gate 42 formed below the control gate 36 through the ONO film 32 is formed in alignment with the control gate 36 (FIG. 12C).

Preferably the SAE mask for patterning the floating gate 42 is laid so as at least to open the memory cell region larger than a region covered with the ONO mask because the unnecessary ONO film 32 and the polycrystalline silicon film 30 left in the memory cell region 18 have to be removed.

The semiconductor device including the floating gate is thus fabricated, where the residue generated on the step can be easily removed, and accordingly the generation of particles can be prevented.

As described above, according to the present embodiment, a pattern-to-be-removed of the Poly 1 mask is laid along the peripheral edge of a pattern of the ONO mask so that the polycrystalline silicon film 30 is absent on the peripheral edge of the ONO mask, whereby the residue along the peripheral edge of the pattern of the ONO mask can be prevented.

The Poly 1 mask and the ONO mask are laid so that no step is formed in another step near the step formed on the device isolation film 24, whereby the residue of the ONO film 32 and the polycrystalline silicon film 30 generated on the step can be easily removed.

A pattern-to-be-removed of the Core S/D mask is laid on the peripheral edge of the memory cell region, and a pattern-to-be-removed of the Poly 1 mask and a pattern-to-be-left of the Core S/D mask are formed inside the pattern-to-be-removed of the Core S/D are formed, whereby no step is formed in another step near the step formed on the device isolation film 24, and accordingly the generation of residue can be suppressed.

In the present embodiment, a pattern-to-be-left of the Core S/D in the memory cell region is laid inside a pattern-to-be-left of the Poly 1 mask, but the layout of FIG. 10 is not essential in the region inside the pattern of the S/D mask.

As exemplified in FIG. 13, a pattern-to-be-left of the Core S/D may be laid on a pattern-to-be-left of the Poly 1 mask.

Figure 14A:
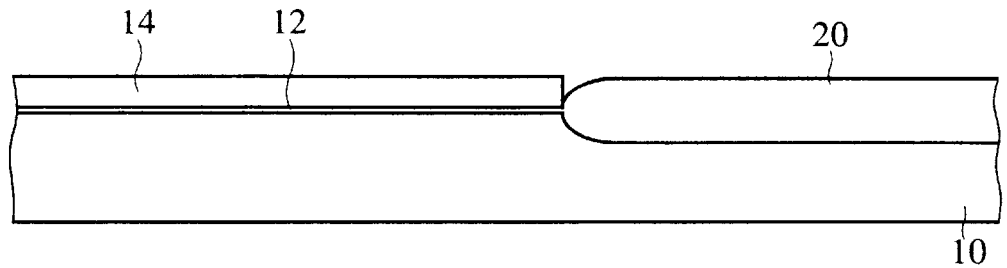
FIGS. 14A–14D are sectional views of a semiconductor device along the line A–A' in FIG. 13 in the steps of the method for fabricating a semiconductor device according to the modification of the third embodiment, which explain the method (Part 1).
Figure 14B:
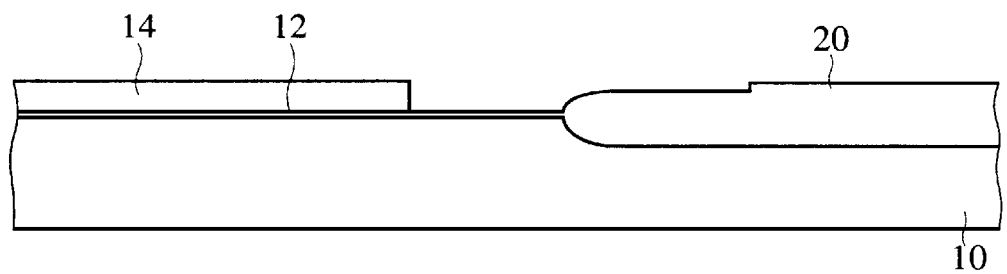
Figure 14C:
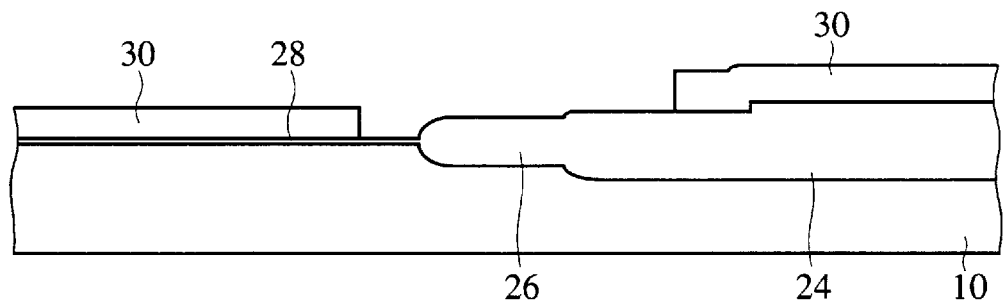
Figure 14D:
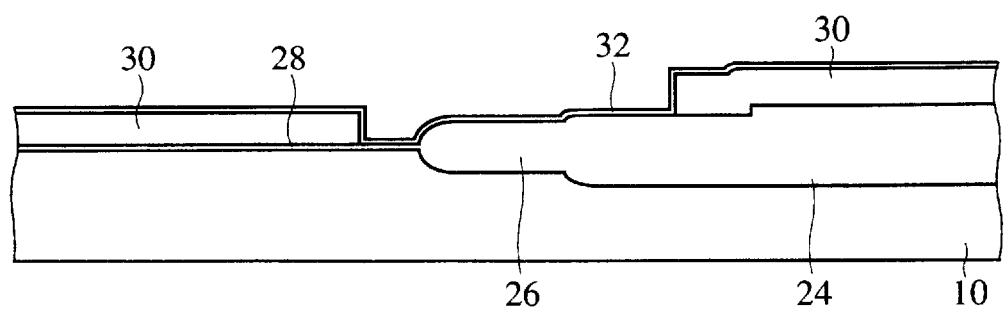
Figure 15A:
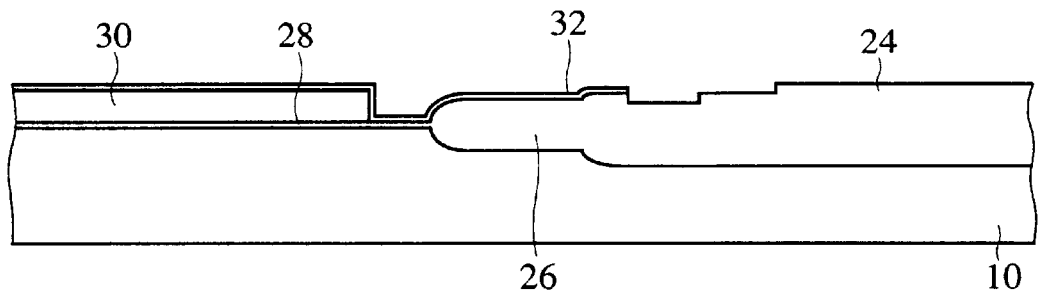
FIGS. 15A–15C are sectional views of a semiconductor device along the line A–A' in FIG. 13 in the steps of the method for fabricating a semiconductor device according to the modification of the third embodiment, which explain the method (Part 2).
Figure 15B:
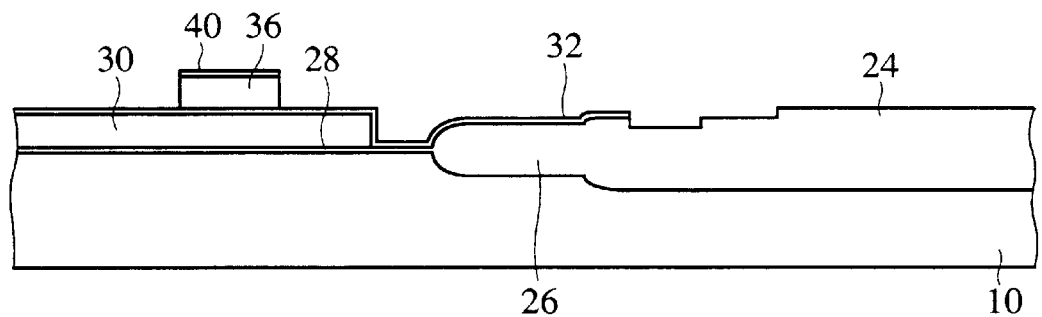
Figure 15C:
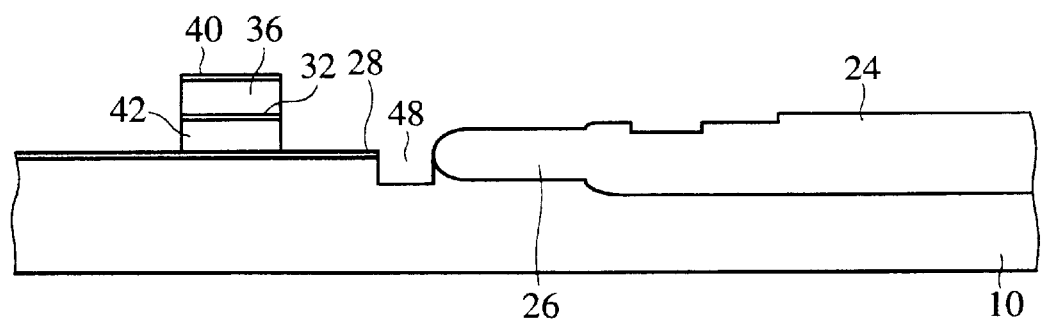

In this case, in the same way as the method for fabricating a semiconductor device shown in FIGS. 11A to FIG. 11C, the polycrystalline silicon film 30 is formed (FIGS. 14A and B) and is patterned by the use of the Poly 1 mask, and the tunnel oxide film 28 is exposed in the region 48 (FIG. 14C). Accordingly, in the same way as the method for fabricating a semiconductor device shown in FIGS. 11D to 12B, the control gate 36 is patterned (FIGS. 14D to FIG. 15B), and the ONO film 32 and the polycrystalline silicon film 30 are patterned in the step of etching using the SAE mask, whereby the silicon substrate 20 in the region 48 is dug (FIG. 15C). However, problems are not caused by the region, because the region 48 does not influence the operation of the device.

A pattern-to-be-left of the Core S/D mask is stripe-shaped but may be mesh-shaped.

It is preferable that these patterns are transformed into a suitable patterns with changing the device structure.

In the method for fabricating a semiconductor device according the above-described first to the third embodiments, the device isolation films 24, 26 of the same silicon nitride film and of thicknesses different from each other are formed, but the problem of generation of the step in the device isolation film 24 takes place also in the method for fabricating a semiconductor device in which LOCOS process is twice conducted using different silicon nitride films. Accordingly the present invention is applicable to this method for fabricating a semiconductor device.

A method for fabricating a semiconductor device in which a thick device isolation film is formed and is selectively etched to form a thin and a thick device isolation films is known. In this case, often a step is generated in the thick device isolation film. The present invention is also applicable to this method for fabricating a semiconductor device.

What is claimed is:

1. A method for fabricating a semiconductor device comprising:

a device isolation film forming step of oxidizing a semiconductor substrate with a mask film having a first pattern as a mask to form an oxide film in a device isolation region of a peripheral circuit region and oxidizing the semiconductor substrate with a mask film having a second pattern as a mask to form a first device isolation film which is formed by further oxidizing said oxide film, and a second device isolation film in a memory cell region;

a first conducting film forming step of depositing a first conducting film to be a floating gate on the semiconductor substrate with said device isolation films formed on, and processing the first conducting film with a third pattern having a pattern-to-be-removed having on a peripheral edge of the memory cell region as a mask;

an insulation film forming step of depositing an insulation film on the semiconductor substrate with the first conducting film formed on, and processing the insulation film with a fourth mask having a pattern covering the memory cell region whose peripheral edge is positioned on said pattern-to-be-removed of the third pattern so that the insulation film covers an edge of the first conducting film; and a gate electrode forming step of depositing a second conducting film on the semiconductor substrate with the insulation film formed on and processing the second conducting film with a mask having a fifth pattern to form a gate electrode of the second conducting film in the peripheral circuit region and a control gate in the memory cell region.

2. A method for fabricating a semiconductor device according to claim 1, wherein the second pattern includes a pattern-to-be-removed on a peripheral edge of the memory cell region.

3. A method for fabricating a semiconductor device according to claim 1, wherein the pattern-to-be-removed of the third pattern is positioned inside the pattern-to-be-removed of the second pattern.

4. A method for fabricating a semiconductor device according to claim 2, wherein the pattern-to-be-removed of the third pattern is positioned inside the pattern-to-be-removed of the second pattern.

5. A method for fabricating a semiconductor device comprising:

a device isolation film forming step of oxidizing a semiconductor substrate with a mask film having a first pattern as a mask to form an oxide film in a device isolation region of a peripheral circuit region and oxidizing the semiconductor substrate with a mask film having a second pattern as a mask to form a first device isolation film which is formed by further oxidizing said oxide film, and a second device isolation film in a memory cell region;

a first conducting film forming step of depositing a first conducting film to be a floating gate on the semiconductor substrate with said device isolation films formed on, and processing the first conducting film with a mask having a third pattern whose edge is positioned outside a first region where a pattern-to-be-removed of the first pattern and a pattern-to-be-removed of the second pattern are laid on each other;

an insulation film forming step of depositing an insulation film on the semiconductor substrate with the first conducting film formed on and processing the insulation film with a mask having a fourth pattern whose edge is positioned outside the first region; and a gate electrode forming step of deposition a second conducting film on the semiconductor substrate with the insulation film formed on and processing the second conducting film into a fifth pattern to form a gate electrode of the first conducting film in said peripheral circuit region and a control gate in said memory cell region.

6. A method for fabricating a semiconductor device according to claim 5, wherein a pattern-to-be-removed of the third pattern is positioned inside a pattern-to-be-left of the fourth pattern.

7. A method for fabricating a semiconductor device according to claim 5, wherein an edge of the fourth pattern laid on a pattern-to-be-left of the fifth pattern is positioned inside the pattern-to-be-removed of the second pattern.

8. A method for fabricating a semiconductor device according to claim 6, wherein an edge of the fourth pattern laid on a pattern-to-be-left of the fifth pattern is positioned inside the pattern-to-be-removed of the second pattern.

9. A method for fabricating a semiconductor device according to claim 1, wherein in the insulation film forming step, the insulation film and the first conducting film in the peripheral circuit region are removed.

10. A method for fabricating a semiconductor device according to claim 5, wherein in the insulation film forming step, the insulation film and the first conducting film in the peripheral circuit region are removed.

11. A method for fabricating a semiconductor device according to claim 1, wherein the device isolation film forming step includes the steps of:

oxidizing the semiconductor substrate with the mask film having the first pattern as a mask to form the first device isolation film on the semiconductor substrate;

removing the mask film; and oxidizing the semiconductor substrate with the mask film having the second pattern as a mask to form on the semiconductor substrate the second device isolation film thinner than the first device isolation film.

12. A method for fabricating a semiconductor device according to claim 5, wherein the device isolation film forming step includes the steps of:

oxidizing the semiconductor substrate with the mask film having the first pattern as a mask to form the first device isolation film on the semiconductor substrate;

removing the mask film; and oxidizing the semiconductor substrate with the mask film having the second pattern as a mask to form on the semiconductor substrate the second device isolation film thinner than the first device isolation film.

* * * * *